United States Patent [19]

Bush et al.

[11] 3,983,488

[45] Sept. 28, 1976

[54] FREQUENCY-MODULATION DEMODULATOR THRESHOLD EXTENSION DEVICE

[75] Inventors: John A. Bush, Sunol; Drew R. Lance, Saratoga; John E. Altstatt, Palo Alto, all of Calif.

[73] Assignee: California Microwave, Inc., Sunnyvale, Calif.

[22] Filed: June 17, 1974

[21] Appl. No.: 479,808

[52] U.S. Cl. .............................. 325/346; 325/348; 325/478; 329/122
[51] Int. Cl.² ......................................... H04B 1/10
[58] Field of Search .............. 325/45, 344, 346–349, 325/377, 416, 417–423, 425, 427, 473, 476, 478; 329/50, 110, 122, 123, 130, 136

[56] References Cited
UNITED STATES PATENTS

| | | | |
|---|---|---|---|
| 3,205,438 | 9/1965 | Buck | 329/110 |
| 3,346,815 | 10/1967 | Haggai | 325/340 |
| 3,397,360 | 8/1968 | Kaneko et al. | 325/45 |
| 3,588,705 | 6/1971 | Paine et al. | 325/348 |
| 3,742,361 | 6/1973 | Wason | 325/346 |

Primary Examiner—Benedict V. Safourek
Assistant Examiner—Jin F. Ng
Attorney, Agent, or Firm—Boone, Schatzel, Hamrick & Knudsen

[57] ABSTRACT

A threshold extension device for use in a frequency modulation demodulator circuit to minimize effects of impulse noise, usually referred to as "clicks", which normaly appear in the demodulated output signal, and including a delay line for delaying the demodulated signal, a follow and hold circuit for selectively omitting the click impulses from the delayed signal, a detector for detecting the occurrence of an event which will give rise to a click impulse in the demodulated signal, and a detector driven control signal generator for controlling operation of the follow and hold circuit.

11 Claims, 7 Drawing Figures

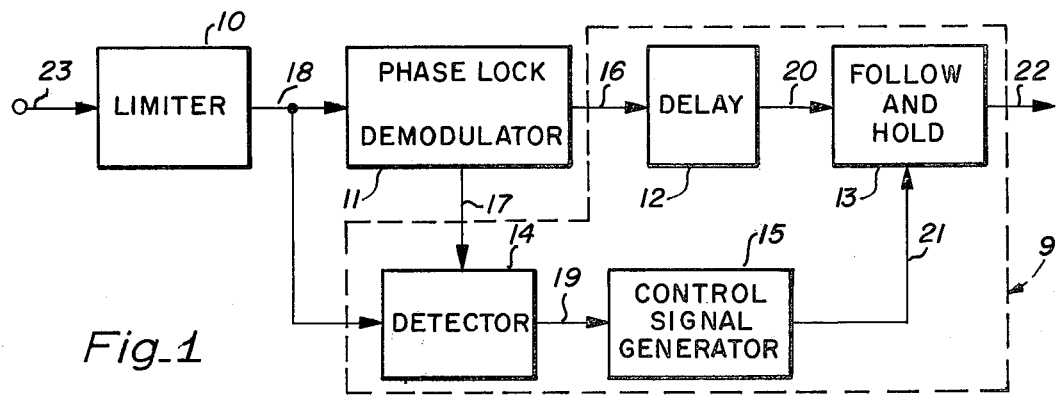
Fig_1
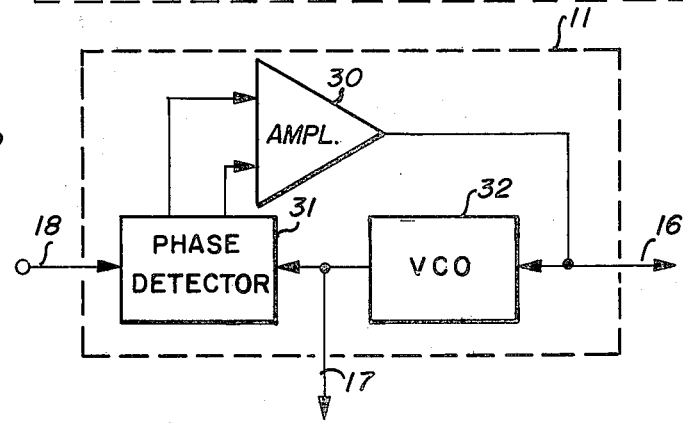
Fig_2
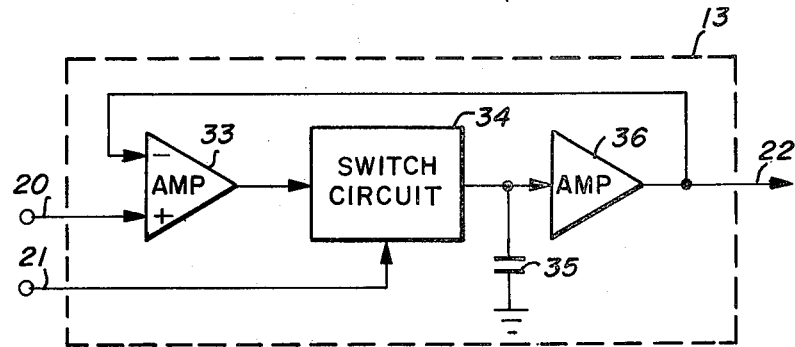
Fig_3
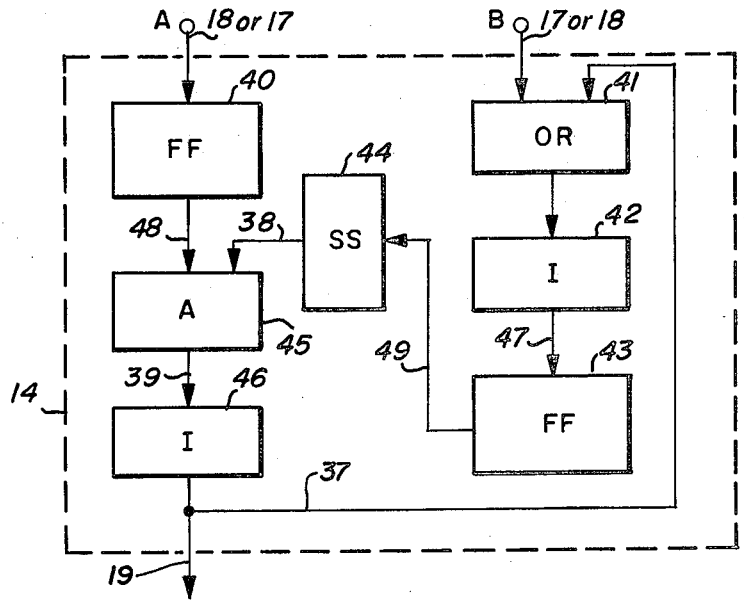
Fig_4

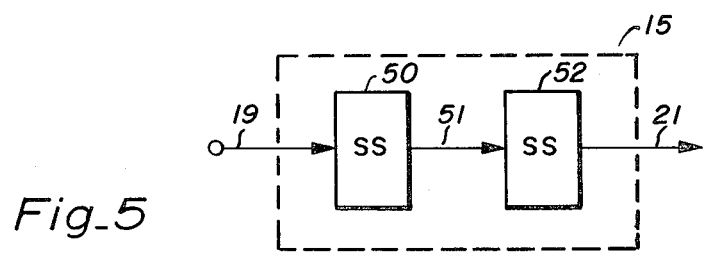
Fig_5
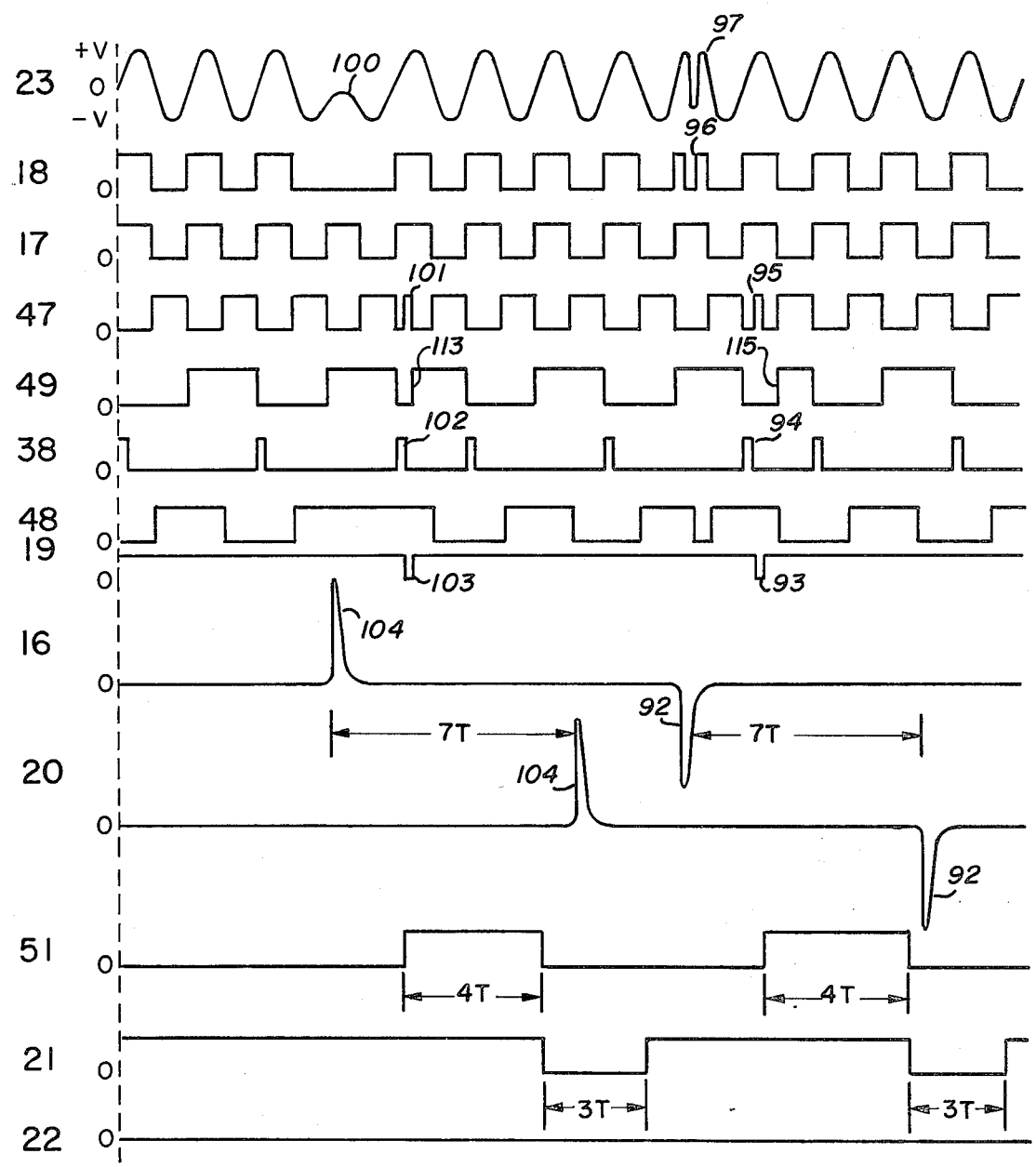
Fig_6

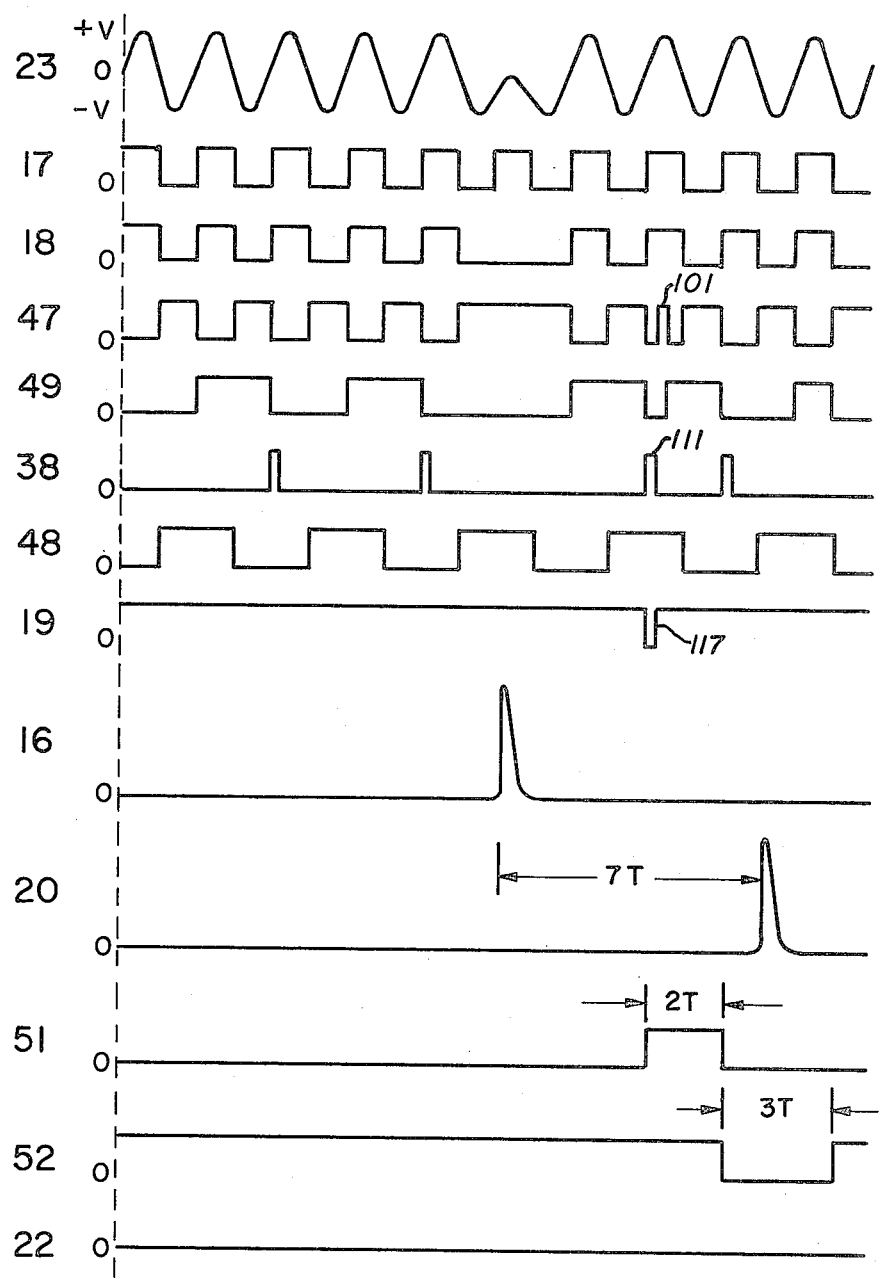
Fig_7

FREQUENCY-MODULATION DEMODULATOR THRESHOLD EXTENSION DEVICE

BACKGROUND OF THE INVENTION

1. Field of the Invention

The present invention relates generally to frequency modulated (FM) demodulators, and more particularly to a threshold extension device for improving the operating performance of such demodulators for input signals having relatively low signal-to-noise ratios.

2. Description of the Prior Art

FM communication receivers are sometimes employed to receive extremely weak incoming frequency modulated radio signals and to recover therefrom the intelligence or information originally transmitted from a distant FM transmitter. A good example of this occurs in the case of the down-link or space-to-earth portion of a spacecraft communication system where the spacecraft is at a lunar distance or greater with respect to a ground station receiver located on the earth and where space and power limitations aboard the spacecraft dictate that the transmitter be of relatively low power. Since the low power transmitter and the vast intervening distance separating the spacecraft and the ground station receiver combine to cause the radio signals received at the ground station to be extremely weak, the ground station receiver must be capable of processing the signal without superimposing thereon any appreciable amount of electrical circuit noise if the transmitted intelligence is to be recovered with a minimum of degradation.

One of the factors having a substantial effect on the operational capability of the communications receiver is the operating performance of the FM demodulator or demodulators used in the receiver. As the received signal becomes weaker, a threshold point is reached below which the demodulator usually begins to itself introduce electrical noise of noticeable and objectionable character. A large measure of such noise is due to click type noise impulses which are generated by the demodulation process itself, and which are a result of the interaction between randomly varying electronic noise and the signal input to the demodulator. More particularly, when operating below a certain threshold level, the signal amplitude will often be of the same order of magnitude as some of the random noise fluctuations within the demodulator and as a result, the noise components will combine with the signal components and produce a sudden 360° phase excursion in the demodulator output and an undesirable click impulse will be impressed upon the output of the demodulator. Such click impulses are particularly undesirable in that they have substantial low frequency content which is not suppressed by the conventional demodulator output filters.

The prior art approach toward solving the problem of click impulses has been to provide means responsive to the demodulator output for detecting the presence of the click impulses and then removing the click impulses from the output signal. An example of one such technique is disclosed in U.S. Pat. No. 3,588,705, entitled "Frequency Modulation Demodulator Threshold Extension Device," wherein amplitude level detectors are used to detect the existence of clicks by examining the amplitude characteristics of the demodulated signal. Such an approach does not, however, completely solve the problem since any click impulses which do not reach the predetermined detection levels will not be detected and eliminated from the demodulated output signal.

SUMMARY OF THE PRESENT INVENTION

It is therefore an object of the present invention to provide an improved threshold extension device for improving the performance of FM communication receivers in receiving relatively weak signals.

Another object of the present invention is to provide a new and improved device for extending the normal operating range of FM demodulators to include very low values of input signal-to-noise ratio.

Still another object of the present invention is to provide a new and improved threshold extension device which detects the conditions that cause the click impulses rather than the presence of such impulses, and which then effectively eliminates that portion of the demodulated signal which contains the click impulse.

In accordance with the present invention a threshold extension device is provided for use with a phase locked FM demodulator which includes a delay line, a follow and hold circuit, a detector, and a control signal generator. The amplitude limited intermediate frequency signal input to the demodulator and the output signal developed by the voltage controlled oscillator of the demodulator are both input to the detector wherein missing or extra pulses occurring in either of the two signals, events which give rise to the generation of a click impulse in the output of the demodulator, are detected. Should such an event be detected the detector will cause the control signal generator to develop a control signal which actuates the follow and hold circuit to excise the click impulse from the demodulated output signal which has been time delayed by the delay line.

An important advantage of the present invention is that by detecting the cause of the click impulse rather than the actual occurrence of the click impulse itself, a more accurate and effective elimination of the resultant noise is permitted.

Another advantage is that due to the improvement in receiver signal-to-noise characteristics afforded by the present invention, the size of the signal receiving antenna may be substantially reduced.

The foregoing and other objects, features and advantages of the invention will be apparent from the following description of a preferred embodiment of the invention which is illustrated in the several figures of the accompanying drawing.

IN THE DRAWING

FIG. 1 is a block diagram illustrating a portion of an FM communication receiver including a threshold extension device in accordance with the present invention;

FIG. 2 is a block diagram further illustrating the phase lock loop frequency modulation demodulator shown in FIG. 1;

FIG. 3 is a block diagram further illustrating the follow and hold circuit shown in FIG. 1;

FIG. 4 is a block diagram further illustrating the detector shown in FIG. 1;

FIG. 5 is a block diagram further illustrating the control signal generator shown in FIG. 1;

FIG. 6 is a set of waveforms used to describe one mode of operation of the embodiment shown in FIG. 1; and FIG. 7 is a set of waveforms used to describe an alternative mode of operation of the embodiment shown in FIG. 1.

DETAILED DESCRIPTION OF THE PREFERRED EMBODIMENT

Referring now to FIG. 1 of the drawing, a block diagram of a portion of the output section of an FM receiver is shown including a limiter 10 for receiving the IF signal at input terminal 23, a phase lock demodulator 11 for demodulating the limited IF signal, and a threshold extension device 9 in accordance with the present invention. Limiter 10 is essentially a zero crossing detector which in effect converts the frequency modulated IF signal generated by other portions of the FM receiver (not shown) into a pulse width modulated pulse train that for simplicity will hereinafter be referred to as the IF signal. Demodulator 11 receives and demodulates the IF signal to develop a demodulated audio frequency signal on line 16.

The principal operational components of threshold extension device 9 include a delay line 12, a follow and hold circuit 13, a detector 14 and a control signal generator 15. Delay line 12 can be a bucket brigade delay line or other type of delay device suitable for delaying demodulated FM communications signals. Follow and hold circuit 13 is a voltage controlled switching device, as will be explained in regard to FIG. 3 below. Detector 14 has a first input connected to line 18 for receiving the IF signal applied to demodulator 11 and has a second input for receiving the signal developed by the voltage controlled oscillator of the phase locked demodulator 11. As will be further explained below, detector 14 will generate a signal on line 19 for actuating follow and hold circuit 13 whenever there exists a missing or extra pulse in the IF signal appearing on line 18 as compared to the VCO signal appearing on line 17. The missing or extra pulse in the IF signal is characteristic of the effect created by noise or other interferences combined with the FM signal being processed and normally gives rise to a click impulse in the demodulator output.

FIG. 2 shows a simplified block diagram of the phase lock demodulator 11 which is comprised of a loop error amplifier and a filter 30, a phase detector 31 and a voltage controlled oscillator (VCO) 32. Phase detector 31 compares the phase of the pulses in the IF pulse train input on line 18 to the reference signal developed by VCO 32 on line 17 and generates an analog signal indicative of the phase relationship therebetween. In effect, detector 31 measures the time displacement between the trailing edges of the pulses of the reference signal generated by VCO 32 and the trailing edges of the pulses of the IF signal on line 18 and develops an error output commensurate therewith which is fed back to the control input of VCO 32 through amplifier 30 so as to cause VCO 32 to be phase locked to the IF signal. Should a condition occur wherein the phase difference between the IF signal and the reference signal exceeds 180°, the loop phase lock will temporarily be lost and detector 31 will generate a large amplitude fast occurring 360° phase error signal referred to in the art as a "click" impulse. This condition will normally occur when two successive negative-going transitions occur in the VCO reference signal without the occurrence of a negative-going transition in the IF signal or when two successive negative-going transitions occur in the IF signal without the occurrence of a negative-going transition in the VCO reference signal.

Referring to FIG. 3, follow and hold circuit 13 is shown to include an input amplifier 33, a switching circuit 34, a storage capacitor 35, and an output amplifier 36. In the absence of an inhibiting control signal input on line 21, switching circuit 34 passes signals directly from input amplifier 33 to output amplifier 36 and the voltage across capacitor 35 varies in accordance with the signal voltage. However, when a control signal is developed on line 21, switching circuit 34 interrupts the signal flow and capacitor 35 functions as a signal storage device holding the input to amplifier 36 at the signal voltage level which immediately preceded actuation of switching circuit 34. The functional effect then of circuit 13 is to cause the output on line 22 to follow the voltage on line 20 in the absence of a control signal on line 21 and to hold the last voltage on line 22 during the period that a control signal appears on line 21.

Referring now to FIG. 4, detector 14 is shown to include input terminals A and B, a flip-flop 40, an OR gate 41, an inverter 42, a flip-flop 43, a single shot 44, an AND gate 45, and a second inverter 46. Terminal A is connected to the complimentary input of flip-flop 40 such that flip-flop 40 effectively divides the incoming frequency of the signal impressed on terminal A by two. Terminal B is connected through OR gate 41 to inverter 42 which inverts the signal impressed on terminal B before it is input to the complimentary input of flip-flop 43. Similar to the action of flip-flop 40, flip-flop 43 effectively divides the frequency of the signal occurring on line 47 by two. The output of flip-flop 43 is applied to single shot 44 which generates one output pulse on line 38 for each cycle of operation of flip-flop 43. The width of the pulses generated by single shot 44 is small with respect to the shortest half period of any frequency that is to be generated by flip-flop 43 during normal operation of the FM demodulator. The output of single shot 44 provides one of the inputs to AND gate 45, and the output from flip-flop 40 provides the other input. In this configuration, the output pulses from single shot 44 will strobe the signal generated by flip-flop 40 and cause an output pulse to be generated by AND gate 45 each time both signals are simultaneously positive. The output of gate 45 is fed through inverter 46 where it is inverted to develop the detector output signal on line 19. A feed-back circuit 37 connects the detector output to a second input of gate 41 to complement flip-flop 43 following each detected click so as to maintain proper phase relationship with flip-flop 40. Further description of the operation of detector 14 will be given below.

The output of detector 14 is connected to the input of control signal generator 15 as shown in FIG. 1. As illustrated in FIG. 5, generator 15 includes a single shot multi-vibrator 50, which adjusts the time phasing of the control signal to coincide with the output of delay line 12, and a second single shot multi-vibrator 52 which receives the output of single shot 50 and generates a control signal on line 21 that is coincident with, but of longer time duration than, the click impulse to be excised.

FIG. 6 is a timing diagram illustrating a series of waveforms numbered to correspond with the similarly number lines of the preceding figures upon which they are developed. These simplified waveforms are useful in describing operation of the threshold extension device 14 when operated in the first described alternative mode with line 18 connected to terminal A and line 17 connected to terminal B.

The input IF signal waveform 23 is for simplicity shown to be of a constant frequency varying between plus and minus V. Waveform irregularities such as might be caused by noise, electrical interference or signal weakness, and which will result in the generation of a click are illustrated at 97 and 100. With the illustrated signal input on line 23, limiter 10 will develop a pulse train, shown as waveform 18, having a standardized amplitude and a pulse rate corresponding to the frequency of waveform 23. However, since the output signal developed by limiter 10 changes signal state each time the input signal crosses zero, there is no pulse generated for cycle 100 (because there is no zero crossing), but an extra pulse is generated for cycle 97 (because there are two extra zero crossings).

Since the error signal generated by detector 31 will be constant where the input frequency is constant, the frequency of the reference signal (shown by waveform 17) developed by VCO 32 will be of the same frequency and will be in phase with waveform 18. Waveform 17 is inverted by inverter 42 to generate waveform 47. The additional short pulses 101 and 95 occurring in waveform 47 are the result of an additional input to OR gate 41 via line 37 and will be discussed later. To obtain proper timing throughout the circuit, the trailing edges of the pulses are used to control the sequence of events. It should be noted, however, that alternatively, either the leading edges or a combination of leading and trailing edges can be used so long as the proper timing relationship between the events is maintained.

Waveforms 49 and 48 correspond to waveforms 18 and 47, respectively, but are of one-half the frequency as a result of waveforms 18 and 47 having been divided by two by flip-flops 40 and 43. Since waveforms 18 and 47 are normally 180° out-of-phase, waveforms 49 and 48 are normally 90° out-of-phase. Single shot 44 triggers on the trailing edges of the pulses of waveform 49 and develops the waveform 38. Waveforms 38 and 48 are then input to AND gate 45 to develop an output on line 39 when both signals are positive. The signal developed on line 39 is inverted by inverter 46 to form the output waveform 19.

However, since the pulses of waveform 38 are developed by the negative going transitions of waveform 49 and thus normally occur between the pulses of waveform 48, no output is normally developed by gate 45. But from these waveforms it can be seen that a missing or extra transition in waveform 18 will cause the output of flip-flop 40 to be shifted in phase by 180° relative to the output of flip-flop 43 and will thus allow the pulses 102 and 94, generated by single shot 44, to pass through AND gate 45, be inverted by inverter 46 and develop the corresponding pulses 103 and 93 of waveform 19. Since the occurrence of a click causing condition will in turn cause waveform 48 to be shifted in phase by 180° relative to waveform 49, it is necessary following each click detection that steps be taken to re-establish the original phase relationship between the two signals. This is accomplished by feeding the output pulses 103 and 93 back through OR gate 41 and inverter 42 to cause flip-flop 43 to be reset and in effect shift 180° to realign itself with flip-flop 40. The resetting operation is illustrated by the positive-going transitions 113 and 115.

Waveform 16 illustrates the output of FM demodulator 11. Since the IF signal 23 is shown for purposes of illustration as being of a fixed frequency, the output of demodulator 11 is shown to be of a constant value except for the two impulses 104 and 92, which depict click impulses. As previously indicated, these impulses occur because the phase relationships between waveform 18 and waveform 17 during cycles 100 and 97 cause the generated error voltage waveform 16 to suddenly go from an in-phase value to a maximum out-of-phase value. Waveform 20 is a replica of waveform 16 delayed in time by delay line 12.

Single shot 50 is triggered by the negative-going transitions of the pulses of waveform 19 and generates the pulses illustrated by waveform 51. Waveform 21 illustrates the control signal pulses developed by single shot 52 time coincident with the time delayed click impulses of waveform 20. These pulses are triggered by the negative-going transitions of the pulses of waveform 51. If the delay period of delay line 12 is arbitrarily designated as being 7T units of time and a gating window of 3T units of time is required to insure complete excision of the click impulse, then it will be apparent that the duration of the pulses generated by single shot 50 on line 51 should be 4T units in order to insure that the actuated periods of switching circuit 34 are time centered relative to the delayed input thereto of the click impulses.

To be consistent with the preceding waveforms the output of follow and hold circuit 13 is represented by the straight line waveform 22. In practice, however, the input to follow and hold circuit 13 will actually be a time varying waveform with the click impulses superimposed upon it, and the output waveform will correspond to the time varying waveform except that the click containing segments will be flattened due to the sample and hold operation. The slight signal distortion resulting from the sample and hold operation is well within acceptable limits.

As indicated in FIG. 4, either the IF signal or the output of VCO 32 may be used to drive single shot 44 when the other is input to flip-flop 40. However, the two alternative connections will require different pulse width settings of single shot 50 to adjust for the differences in signal processing times.

FIG. 7 is a timing diagram illustrating operation of the threshold extension device configuration in which the VCO output on line 17 (FIG. 4) is connected to terminal A, and the IF signal from limiter 10 is connected to terminal B, of detector 14. The input signal to limiter 10 is shown as waveform 23, the input signal to FM demodulator 11 and to terminal B of detector 14 is shown as waveform 18, and the output of the VCO 32 is shown as waveform 17. Waveform 47 is waveform 18 inverted by inverter 42. The output of flip-flop 43 is shown as waveform 49 and the output of flip-flop 40 is shown as waveform 48. Again, the negative transitions of the pulses of waveform 49 cause single shot 44 to generate a series of pulses timed such that they normally appear during the down or zero portion of waveform 48 and are not passed by AND gate 45. It should be noted that the 90° phase difference between the two waveforms 48 and 49 is the same for this alternative connection of inputs to terminals A and B as it was for the connection previously described. The inputs to AND gate 45, waveforms 48 and 38, combine to develop output signal waveform 19. Waveform 16 shows the generated click impulse and waveform 20 shows the click impulse after being delayed for a period of time 7T.

Waveform 52 of FIG. 7 again shows the control signal waveform for follow and hold circuit 13, where the duration of the control signal is 3T units in length and is centered about the occurrence of the click impulse signal of waveform 20. Waveform 51 shows that the corresponding duration of single shot 50 need now be only 2T units in length to properly center the control signal about the click impulse because the generation of pulse 111, after a discontinuity in the IF signal waveform 23, is triggered by the trailing edge of the next pulse of waveform 49. This additional delay of the output of detector 14 was not present in the first described configuration because the pulses of waveform 38 in that configuration were generated from the continuous VCO 32 signal (waveform 17 of FIG. 6).

Waveform 22 illustrates the output of follow and hold circuit 13, showing that the click impulse which appears in waveform 20, the input to follow and hold circuit 13, does not appear in the output waveform 22.

As in the other embodiment, pulse 117 of waveform 19 is fed back through OR gate 41 and inverter 42 to complement flip-flop 43 and return it to the proper phase relationship with flip-flop 40.

In summary, the threshold extension device of the present invention detects the occurrence of a click causing missing or extra pulse in the IF signal, delays the output of the demodulator, and then excises the click impulse from the delayed demodulator output. It should be clearly understood that this device detects the cause of click impulse rather than the click impulse itself and thus insures that if any condition arises that would develop a click impulse, the resulting click impulse will be eliminated from the demodulator output.

While there has been described what is at present considered to be a preferred embodiment of the invention, it will be understood that various alterations and modifications may be made therein and it is intended that the appended claims cover all such alterations and modifications as fall within the true spirit and scope of the invention.

What is claimed is:

1. A threshold extension circuit for use in a receiver having a phase locked demodulator, comprising:
    a delay means and a follow-and-hold means coupled together in a series circuit for connecting the output of the demodulator to a receiver output terminal, said delay means being operative to delay the demodulated signal developed by the demodulator for a predetermined period of time, said follow-and-hold means being responsive to a control signal and operative to interrupt said series circuit and to hold the signal level at the output terminal constant during such interruption;
    detector means having a first input for receiving the VCO signal developed by the voltage controlled oscillator of the demodulator and a second input for receiving an IF signal input to the demodulator, said detector being operative to detect a relative phase shift of greater than 180° between said IF signal and said VCO signal and to develop a detector output signal; and
    control signal generating means responsive to said detector output signal and operative to generate said control signal, said control signal causing said follow-and-hold means to interrupt said series circuit a short period of time before the occurrence of a click impulse in the delayed demodulated signal caused by said relative phase shift and to terminate the interruption a short period of time after the occurrence of the click impulse in the delayed demodulated signal thereby effectively removing the click impulse from the signal developed at the receiver output terminal.

2. In an FM receiver including a phase locked demodulator for receiving an IF signal and for phase comparing the IF signal to the VCO signal developed by its voltage controlled oscillator to develop a demodulated signal, and a threshold extension device for improving the operating performance of the receiver by eliminating click impulses appearing in the demodulated signal, an improved threshold extension device comprising:
    a delay means and a follow-and-hold means connected in a series circuit coupling the output of the demodulator to the receiver output terminal, said delay means being operative to delay the demodulated signal for a predetermined period of time, said follow-and-hold means being responsive to a control signal and operative to interrupt said series circuit and to hold the signal level at the receiver output terminal constant during such interruption;
    detector means for monitoring the IF signal and the VCO signal and for developing a detector output signal when a phase shift of greater than 180° is detected between the normal phase relationship of the IF signal and the VCO signal; and
    control signal generating means responsive to said detector output signal and operative to generate said control signal, said control signal causing said follow-and-hold means to interrupt said series circuit a short period of time before the occurrence of a click impulse in the delayed demodulated signal and to terminate the interruption a short period of time after the occurrence of the click impulse in the delayed demodulated signal thereby effectively removing the click impulse from the signal developed at the receiver output terminal.

3. In an FM receiver as recited in claim 2 wherein said detector means includes means responsive to the IF signal and operative to generate a first square wave signal having a frequency equal to one-half the frequency of the IF signal, means for inverting the VCO signal, means responsive to the inverted VCO signal and operative to generate a second square wave signal normally 90° out-of-phase with said first signal and having a frequency equal to one-half the frequency of the VCO signal, means responsive to said second signal and operative to generate a pulse at a predetermined time during each cycle of said second signal, said pulse normally having a predetermined relationship to said first signal, and means responsive to said pulse and said first signal and operative to generate said detector output signal when the relationship between said pulse and said first signal is other than said predetermined relationship, said detector output signal indicating that a phase shift of greater than 180° has occurred between the IF signal and the VCO signal.

4. In an FM receiver as recited in claim 3 wherein said detector means further includes feedback circuit means responsive to said detector output signal and operative to cause a compensating shift in phase of said inverted VCO signal so as to cause said second signal to assume its normal phase relationship with said first signal.

5. A threshold extension circuit for use in a receiver having a phase locked demodulator, comprising:
 a first terminal for receiving an IF signal input to the demodulator;
 a second terminal for receiving the VCO signal developed by the demodulator voltage controlled oscillator;
 a third terminal for receiving the demodulated signal developed by the demodulator;
 an output terminal;
 a delay means and a follow-and-hold means forming a series circuit between said third terminal and said output terminal, said delay means being operative to delay said demodulated signal for a predetermined period of time, said follow-and-hold means being responsive to a control signal and operative to interrupt said series circuit and to hold the delayed demodulated signal level at said output terminal constant during such interruption;
 detector means having a first input coupled to said first terminal and a second input coupled to said second terminal, said detector being operative to detect a phase shift of greater than 180° between said IF signal and said VCO signal relative to their normal phase relationship and to develop a detector output signal; and
 control signal generating means responsive to said detector output signal and operative to generate said control signal, said control signal causing said follow-and-hold means to interrupt said series circuit a short period of time before the occurrence of a click impulse in the delayed demodulated signal and to terminate the interruption a short period of time after the occurrence of the click impulse in the demodulated signal thereby effectively removing the click impulse from the signal developed at said output terminal.

6. A threshold extension circuit as recited in claim 5 wherein said detector means includes means responsive to said IF signal and operative to generate a first signal having a frequency equal to one-half the frequency of said IF signal, means for inverting said VCO signal, means responsive to the inverted VCO signal and operative to generate a second signal normally 90° out-of-phase with said first signal and having a frequency equal to one-half the frequency of said VCO signal, means responsive to said second signal and operative to generate a pulse at the end of each cycle of said second signal, said pulse normally having a predetermined relationship to said first signal, and means responsive to said pulse and said first signal and operative to generate said detector output signal when the relationship between said pulse and said first signal is other than said predetermined relationship, said detector output signal indicating that a relative phase shift of greater than 180° has occurred between said IF signal and said VCO signal.

7. A threshold extension circuit as recited in claim 6 wherein said detector means further includes feedback circuit means responsive to said detector output signal and operative to introduce a compensating phase shift in said inverted VCO signal to cause said second signal to return to its normal relationship to said first signal.

8. A threshold extension circuit as recited in claim 5 wherein said detector means includes a first flip-flop driven by said IF signal and operative to generate a first square wave signal having a frequency equal to one-half the frequency of said IF signal, an inverter for inverting said VCO signal, a second flip-flop driven by the inverted VCO signal and operative to generate a second square wave signal normally 90° out-of-phase with said first signal and having a frequency equal to one-half the frequency of said VCO signal, a single-shot multivibrator responsive to said second signal and operative to generate a pulse having a signal state normally opposite to the signal state of said first signal, an AND gate responsive to said first signal and said pulse and operative to generate a gated signal when the state of said pulse is the same as the state of said first signal, and a second inverter for inverting said gated signal to develop said detector output signal.

9. A threshold extension circuit as recited in claim 8 wherein said detector means further includes an OR gate for coupling said VCO signal and said detector output signal to said first inverter whereby said detector output signal in effect causes a compensating shift in the phase of the inverted VCO signal which results in said second signal returning to its normal phase relationship with said first signal.

10. A threshold extension circuit as recited in claim 9 wherein said control signal generating means includes a first single-shot multivibrator responsive to said detector output signal and operative to generate a first square wave pulse having a predetermined time duration less than the delay period of said delay means, and a second single-shot multivibrator responsive to said first square wave pulse and operative to generate a second square wave pulse forming said control signal, said second square wave pulse commensing at the end of said first square wave pulse and terminating after a predetermined period of time.

11. A threshold extension circuit as recited in claim 10 wherein said follow-and-hold means includes a switching means in said series circuit and a shunt capacitance means coupled to said series circuit between said switching means and said output terminal, said switching means being normally closed to couple said delayed demodulated signal to said output terminal and being responsive to said control signal to interrupt said series circuit for the duration of said second square wave pulse, said capacitance means being operative to hold said output terminal at the last signal level preceding the interruption of said series circuit for the duration of said second square wave pulse.

* * * * *